United States Patent
Feng et al.

(10) Patent No.: US 9,455,681 B2
(45) Date of Patent: Sep. 27, 2016

(54) BULK ACOUSTIC WAVE RESONATOR HAVING DOPED PIEZOELECTRIC LAYER

(71) Applicant: Avago Technologies General IP (Singapore) Pte. Ltd., Singapore (SG)

(72) Inventors: Chris Feng, Fort Collins, CO (US); Phil Nikkel, Westminster, CO (US); John Choy, Westminster, CO (US); Kevin J. Grannen, Thronton, CO (US); Tangshiun Yeh, Fort Collins, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 224 days.

(21) Appl. No.: 14/191,771

(22) Filed: Feb. 27, 2014

(65) Prior Publication Data

US 2015/0244347 A1 Aug. 27, 2015

(51) Int. Cl.
*H03H 9/15* (2006.01)
*H03H 9/13* (2006.01)
*H03H 9/02* (2006.01)
*H03H 9/17* (2006.01)

(52) U.S. Cl.
CPC ..... *H03H 9/02031* (2013.01); *H03H 9/02157* (2013.01); *H03H 9/173* (2013.01); *H03H 9/175* (2013.01)

(58) Field of Classification Search
CPC ............. H03H 9/02015; H03H 9/02031; H03H 9/02047; H03H 9/0211; H03H 9/02118; H03H 9/02133; H03H 9/172; H03H 9/173; H03H 9/175; H03H 9/562; H03H 9/587; H03H 9/589; H03H 9/02157
USPC ................................................. 333/187–192
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,472,954 B1 * | 10/2002 | Ruby | H03H 3/04 29/25.35 |
| 6,507,983 B1 | 1/2003 | Ruby et al. | |
| 6,828,713 B2 | 12/2004 | Bradley et al. | |
| 6,936,837 B2 * | 8/2005 | Yamada | H03H 9/02094 257/2 |
| 6,954,121 B2 * | 10/2005 | Bradley | H03H 3/04 333/133 |
| 7,280,007 B2 | 10/2007 | Feng et al. | |

(Continued)

OTHER PUBLICATIONS

S.H. Lee, "Influence of Electrodes and Bragg Reflector on the Quality of Thin Film Bulk Acoustic Resonator", 2002 IEEE International Frequency Control Symposium and PDA Exhibition, pp. 45-49.

(Continued)

*Primary Examiner* — Barbara Summons

(57) ABSTRACT

In accordance with a representative embodiment, a bulk acoustic wave (BAW) resonator comprises: a first electrode having a first electrode thickness; a second electrode having a second electrode thickness; and a piezoelectric layer having a piezoelectric layer thickness and being disposed between the first and second electrodes, the piezoelectric layer comprising a piezoelectric material doped with at least one rare earth element. For a particular acoustic coupling coefficient ($kt^2$) value and a series resonance frequency ($F_s$) of the BAW resonator, the first electrode thickness and the second electrode thickness are each greater than a thickness of a first electrode and a thickness of a second electrode of a BAW resonator comprising an undoped piezoelectric layer.

25 Claims, 7 Drawing Sheets

(56) References Cited

U.S. PATENT DOCUMENTS

| | | |
|---|---|---|
| 7,345,410 B2 | 3/2008 | Grannen et al. |
| 7,358,831 B2 | 4/2008 | Larson, III et al. |
| 7,388,454 B2 | 6/2008 | Ruby et al. |
| 7,629,865 B2 | 12/2009 | Ruby |
| 7,714,684 B2 | 5/2010 | Ruby et al. |
| 7,758,979 B2 * | 7/2010 | Akiyama ............ B81B 3/0021 428/698 |
| 7,791,434 B2 | 9/2010 | Fazzio et al. |
| 7,855,618 B2 * | 12/2010 | Frank ................. H03H 9/0095 333/187 |
| 8,188,810 B2 | 5/2012 | Fazzio et al. |
| 8,248,185 B2 | 8/2012 | Choy et al. |
| 2007/0205850 A1 | 9/2007 | Jamneala et al. |
| 2010/0327994 A1 | 12/2010 | Choy et al. |
| 2011/0180391 A1 | 7/2011 | Larson, III et al. |
| 2012/0177816 A1 | 7/2012 | Larson, III et al. |
| 2012/0206015 A1 * | 8/2012 | Choy ................. H03H 9/02118 310/335 |
| 2012/0326807 A1 | 12/2012 | Choy et al. |
| 2013/0127300 A1 | 5/2013 | Umeda et al. |
| 2013/0176086 A1 * | 7/2013 | Bradley ............. H03H 9/1007 333/189 |
| 2013/0235001 A1 | 9/2013 | Yun et al. |

OTHER PUBLICATIONS

Co-pending U.S. Appl. No. 14/161,564, filed Jan. 22, 2014.
Co-pending U.S. Appl. No. 13/662,460, filed Oct. 27, 2012.
Co-pending U.S. Appl. No. 13/906,873, filed May 31, 2013.
Li-Wen Hung, "High-Q Low-Impedance MEMS Resonators", 2011, eScholarship University of California Electronic Thesis and Dissertations UC Berkeley, Spring 2011, 152 pages.
Mai Linh, "Development of RF FBAR Devices for Wireless Application", Jul. 1, 2008, Korea Advanced Institute of Science and Technology (KAIST), 123 pages.

* cited by examiner

BULK ACOUSTIC WAVE RESONATOR HAVING DOPED PIEZOELECTRIC LAYER

BACKGROUND

Transducers generally convert electrical signals to mechanical signals or vibrations, and/or mechanical signals or vibrations to electrical signals. Acoustic transducers, in particular, convert electrical signals to acoustic signals (sound waves) and convert received acoustic waves to electrical signals via inverse and direct piezoelectric effect. Acoustic transducers generally include acoustic resonators, such as surface acoustic wave (SAW) resonators and bulk acoustic wave (BAW) resonators, and may be used in a wide variety of electronic applications, such as cellular telephones, personal digital assistants (PDAs), electronic gaming devices, laptop computers and other portable communications devices. BAW resonators include an acoustic or resonator stack disposed over an acoustic reflector. For example, BAW resonators include thin film bulk acoustic resonators (FBARs), which include resonator stacks formed over a substrate cavity, which functions as the acoustic reflector, and solidly mounted resonators (SMRs), which include resonator stacks formed over alternating stacked layers of low acoustic impedance and high acoustic impedance materials (e.g., an Bragg mirror). The BAW resonators may be used for electrical filters and voltage transformers, for example.

Generally, an acoustic resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at a high temperature (e.g., above 400° C.). The acoustic stack of a BAW resonator comprises a first electrode, a piezoelectric layer disposed over the first electrode, and a second electrode disposed over the piezoelectric layer. The acoustic stack is disposed over the acoustic reflector. The series resonance frequency ($F_s$) of the BAW resonator is the frequency at which the dipole vibration in the piezoelectric layer of the BAW resonator is in phase with the applied electric field. On a Smith Chart, the series resonance frequency ($F_s$) is the frequency at which the Q circle crosses the horizontal axis. As is known, the series resonance frequency ($F_s$) is governed by, inter alia, the total thickness of the layers of the acoustic stack. As can be appreciated, as the resonance frequency increases, the total thickness of the acoustic stack decreases. Moreover, the bandwidth of the BAW resonator determines the thickness of the piezoelectric layer. Specifically, for a desired bandwidth a certain electromechanical coupling coefficient ($kt^2$) is required to meet that particular bandwidth requirement. The $kt^2$ of a BAW resonator is influenced by several factors, such as the dimensions (e.g., thickness), composition, and structural properties of the piezoelectric material and electrodes. Generally, for a particular piezoelectric material, a greater $kt^2$ requires a greater thickness of piezoelectric material. As such, once the bandwidth is determined, the $kt^2$ is set, and the thickness of the piezoelectric layer of the BAW resonator is fixed. Accordingly, if a higher resonance frequency for a particular BAW resonator is desired, any reduction in thickness of the layers in the acoustic stack cannot be made in the piezoelectric layer, but rather must be made by reducing the thickness of the electrodes.

While reducing the thickness of the electrodes of the acoustic stack provides an increase in the resonance frequency of the BAW resonator, this reduction in the thickness of the electrodes comes at the expense of performance of the BAW resonator. For example, reduced electrode thickness results in a higher sheet resistance in the electrodes of the acoustic stack. The higher sheet resistance results in a higher series resistance (Rs) of the BAW resonator and an undesired lower quality factor around series resonance frequency $F_s$ (Qs). Moreover, as electrode thickness decreases, the acoustic stack becomes less favorable for high parallel resistance (Rp) and as a result the quality factor around parallel resonance frequency $F_p$ (Qp) is undesirably reduced.

What is needed, therefore, is a BAW resonator that overcomes at least the shortcomings of known BAW resonators described above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
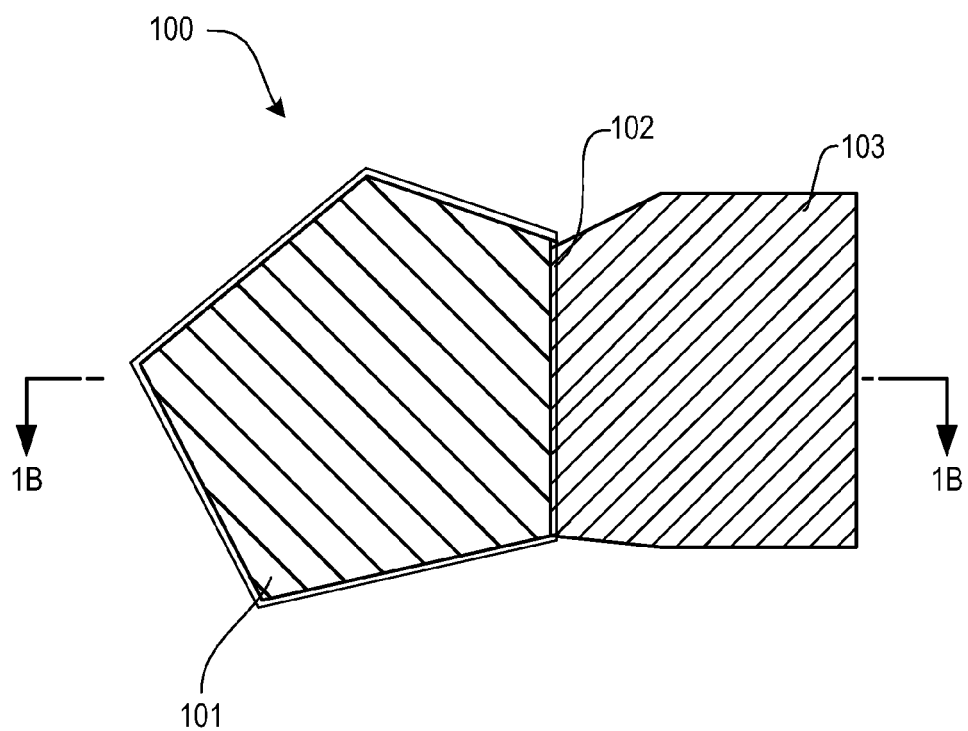
FIG. 1A shows a top-view of a thin film bulk acoustic resonator (FBAR) having a doped piezoelectric layer in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one having ordinary skill in the art. For example, "approximately the same" means that one of ordinary skill in the art would consider the items being compared to be the same.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Aspects of the present teachings are relevant to components of BAW resonator devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791, 434 and 8,188,810, to Fazzio, et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828, 713 to Bradley, et al.; U.S. Patent Application Publication No. 20120326807 to Choy, et al.; U.S. Pat. No. 8,902,023 to Choy, et al.: U.S. Pat. Nos. 9,243,316 and 8,673,121 to Larson III, et al.; U.S. Pat. No. 8,981,876 to Jamneala et al.; U.S. Patent Application Publication No. 201440132117 to John L. Larson III; U.S. Pat. No. 9,136,819 to Choy, et al.: and U.S. Patent Application Publication No. 20140354109 to John Choy, et al. The entire disclosure of each of the patents, published patent applications and patent application listed above are hereby specifically incorporated by reference herein. It is emphasized that the components, materials and method of fabrication described in these patents and patent applications are representative and other methods of fabrication and materials within the purview of one of ordinary skill in the art are also contemplated.

The described embodiments relate generally to bulk acoustic wave (BAW) resonators. Generally, the BAW resonators comprise a first electrode; a second electrode; and a piezoelectric layer disposed between the first and second electrodes. The piezoelectric layer comprises a piezoelectric material doped with at least one rare earth element. By incorporating specific atomic percentages of a rare earth element into the piezoelectric layer, the piezoelectric properties of the piezoelectric material, including piezoelectric coefficient $d_{33}$ and electromechanical coupling coefficient $kt^2$, are improved as compared to the same piezoelectric material that is an entirely stoichiometric (i.e., undoped).

Beneficially, and as described more fully below, because of the improvement in $kt^2$ provided by the doping of the piezoelectric materials of the representative embodiments, for a given bandwidth and resonance frequency, a BAW resonator may be fabricated with a thinner piezoelectric layer than is possible with a known undoped piezoelectric material. Therefore, the thickness constraints on the electrodes can be relaxed, and the thickness of the electrodes of the acoustic stack of the BAW resonator of representative embodiments can be made thicker than electrodes of the acoustic stack of a BAW resonator having a thinner piezoelectric layer than is possible with a known undoped piezoelectric material. Because the electrodes of the BAW resonators of the representative embodiments are comparatively thicker, a lower series resistance (Rs) of the BAW resonator and an improved (Qs) are realized. Moreover, the comparatively thick electrodes result in a BAW resonator having a desirable comparatively high parallel resistance (Rp) and quality factor around parallel resonance frequency Fp (Qp).

In certain embodiments the piezoelectric layer comprises aluminum nitride (AlN) that is doped with scandium (Sc). The atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. When percentages of doping elements in a piezoelectric layer are discussed herein, it is in reference to the total atoms of the piezoelectric layer. Notably, when the percentage of doping elements (e.g., Sc) in a doped AlN layer are discussed herein, it is in reference to the total atoms (not including nitrogen) of the AlN piezoelectric layer 108. So, for example, and as described for example in U.S. patent application Ser. No. 14/161,564, if the Al in the piezoelectric layer of a representative embodiment has an atomic percentage of approximately 95.0%, and the Sc has an atomic percentage of approximately 5.0%, then atomic consistency of the piezoelectric layer 104 may then be represented as $Al_{0.95}Sc_{0.05}$ N.

As mentioned above, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material.

FIG. 1A shows a top view of FBAR 100 in accordance with a representative embodiment. The FBAR 100 comprises a first electrode 101 illustratively having five (5) sides, with a connection side 102 configured to provide an electrical connection to interconnect 103. The interconnect 103 provides electrical signals to the first electrode 101 to excite desired acoustic waves in a piezoelectric layer (not shown in FIG. 1) of the FBAR 100. Notably, an airbridge (not shown), such as described in U.S. Pat. No. 8,248,185 may be provided at the connection side 102, and cantilevered portions (not shown), such as described in U.S. Patent Application Publication 20100327994 may be provided on one or more of the sides, other than the connection side 102.

Figure 1B:
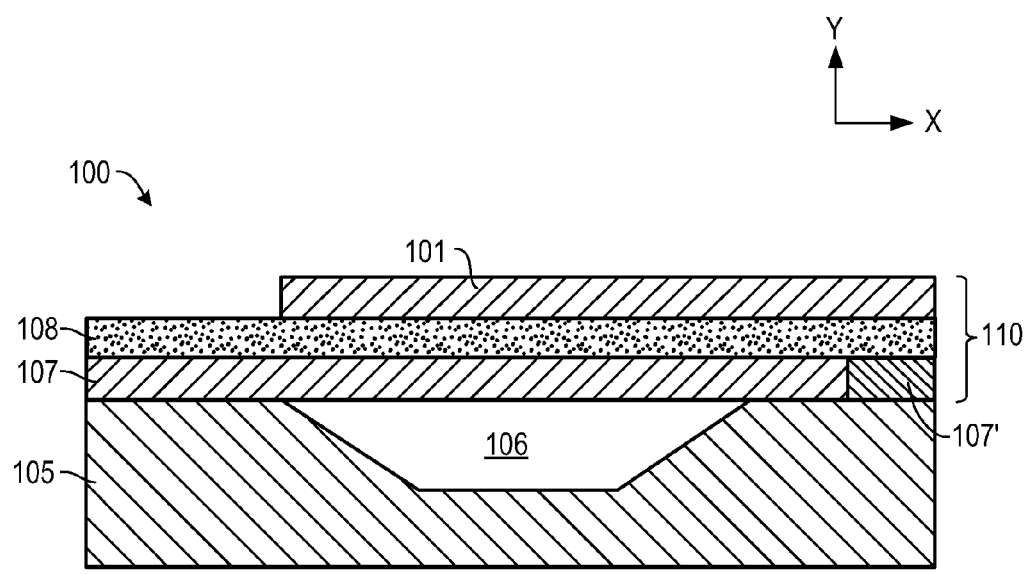
FIG. 1B is a cross-sectional view of the FBAR, taken along the line 1B-1B of FIG. 1A.

FIG. 1B shows a cross-sectional view of the FBAR 100 taken along line 1B-1B in accordance with a representative embodiment. The FBAR 100 includes acoustic stack 110 formed of multiple layers over a substrate 105 having an acoustic reflector 106 that comprises a cavity formed in the substrate 105. A second electrode 107 is disposed over the substrate 105, and extends over the acoustic reflector 106. Notably, an overlap of the acoustic reflector 106, the second electrode 107, the first electrode 101 and a piezoelectric layer 108 defines an active area of the FBAR 100.

A planarization layer 107' may also be provided over the substrate 105 as shown. In a representative embodiment, the planarization layer 107' includes an etch resist borosilicate glass (NEBSG), for example. In general, planarization layer 107' does not need to be present in the structure (as it increases overall processing cost), but when present, it may improve quality of growth of subsequent layers and simplify their processing. The piezoelectric layer 108 is disposed over the second electrode 107, and the first electrode 101 is disposed over the piezoelectric layer 108. As should be appreciated by one of ordinary skill in the art, the structure provided by the second electrode 107, the piezoelectric layer 108 and the first electrode 101 forms the acoustic stack 110 of a BAW resonator.

The substrate 105 may be formed of various types of materials, including semiconductor materials compatible with semiconductor processes, such as silicon (Si), gallium arsenide (GaAs), indium phosphide (InP), or the like, which are useful for integrating connections and electronics, dissipating heat generated from a resonator, thus reducing size and cost, and providing a more robust device. Illustratively, the second electrode 107 and first electrode 101 comprise molybdenum (Mo). Other materials may be used for the first electrode 101 and the second electrode 107, including but not limited to tungsten (W) or a bi-metal material.

As described more fully below, the thickness (y-direction in the coordinate system depicted in FIG. 1B) of the first and second electrodes 101,107 of representative embodiments can be made large compared to the thickness of known FBARs for a particular series resonance frequency ($F_s$) and acoustic coupling coefficient ($kt^2$) because of the piezoelectric layer 108, which is doped with a rare earth element (e.g., scandium (Sc) doped aluminum nitride (AlN)), provides the selected acoustic coupling coefficient ($kt^2$) at a comparatively reduced thickness.

For example, in accordance with certain representative embodiments, an acoustic coupling coefficient ($kt^2$) approaching 7% at a series resonance frequency ($F_s$) of 2200 MHz can be realized with piezoelectric layer 108 having a thickness of approximately 5000 Å. Moreover, in a representative embodiment the piezoelectric layer 108 can provide a maximum acoustic coupling coefficient ($kt^2$) of 9% while having a thickness of 10000 Å. As such, by including the (doped) piezoelectric layer 108, for this particular series resonance frequency ($F_s$), the first and second electrodes 101, 107 can have comparatively large thicknesses.

As described more fully below, for example when using molybdenum for the material for first and second electrodes 101,107, in order to maintain the sheet resistance below a certain level, the first and second electrodes must be at least 2000 Å in thickness. Using known piezoelectric materials at a particular series resonance frequency ($F_s$), this is difficult, if not impossible, without sacrificing the acoustic coupling coefficient ($kt^2$) of the FBAR to the detriment of the bandwidth of the FBAR. By contrast, in accordance with the representative embodiments of the present teachings, at a particular series resonance frequency ($F_s$), providing first and second electrodes 101,107 having a thickness of at least 2000 Å and piezoelectric layer having a desired acoustic coupling coefficient ($kt^2$) is readily effected. In fact, the thicknesses of first and second electrodes 101,107 can be made significantly greater (e.g., 3000 Å to 4000 Å or greater), while maintaining the desired acoustic coupling coefficient ($kt_2$) and bandwidth of the FBAR 100.

The acoustic reflector 106 may be formed using a sacrificial material, such as phosphosilicate glass (PSG), for example, which is subsequently removed. The second electrode 107 may be applied to the top surface of the substrate 105 and the sacrificial material initially filling the acoustic reflector 106, and the first electrode 101 may be applied to the top surface of the piezoelectric layer 108, respectively, using one of a number of known methods, such as described in the above incorporated U.S. patent application Ser. Nos. 14/161,564 and 13/662,460.

In accordance with certain representative embodiments, the piezoelectric layer 108 comprises a rare-earth element doped piezoelectric material (piezoelectric layer), such as AlScN, with an enhanced piezoelectric coefficient $d_{33}$ and an enhanced electromechanical coupling coefficient $kt^2$ by incorporating one or more rare-earth elements into the crystal lattice of a portion of the piezoelectric layer. By incorporating specific atomic percentages of the multiple rare-earth elements, the piezoelectric properties of the rare-earth element doped AlN, including piezoelectric coefficient $d_{33}$ and enhanced electromechanical effective coupling coefficient $kt^2$, are improved as compared to entirely stoichiometric (undoped) AlN. Moreover, and as described more fully below, for a particular bandwidth, acoustic coupling coefficient ($kt^2$) value and a series resonance frequency ($F_s$) the thickness of the piezoelectric layer 108 of FBAR 100 of representative embodiments is thin compared to a known FBAR resonator that is not doped with a rare-earth element.

The piezoelectric layer 108 is doped with a particular atomic percent of a rare-earth element in order to provide a desired bandwidth and acoustic coupling coefficient for a particular series resonance frequency ($F_s$). As noted above, in certain embodiments, the doped piezoelectric material in the piezoelectric layer 108 comprises doped AlN. A number of Al atoms within the AlN crystal lattice are replaced with a rare-earth element at a predetermined percentage, referred to as a "doping element." Because the doping elements replace only Al atoms (e.g., of an Al target), the percentage of nitrogen atoms in the piezoelectric material remains substantially the same regardless of the amount of doping. As such, when percentages of doping elements are discussed herein, it is in reference to the total atoms (not including nitrogen) of the AlN piezoelectric material, and is referred to herein as "atomic percentage."

In various embodiments, AlN material may be doped with scandium (Sc), for example, creating an AlScN compound with a predetermined atomic percentage of Sc. The Sc atom has an atomic radius that is larger than the atomic radius of the Al atom, resulting in a Sc—N bond length (2.25 Å) that is greater than the Al—N bond length (1.90 Å). This difference in bond lengths causes stress in the resulting AlScN material.

In accordance with certain representative embodiments, the atomic percentage of scandium in an aluminum nitride layer is approximately 0.5% to less than approximately 10.0%. More generally, the atomic percentage of scandium in an aluminum nitride layer is approximately 0.5% to approximately 44% in certain embodiments. In yet other representative embodiments, the atomic percentage of scandium in an aluminum nitride layer is approximately 2.5% to less than approximately 5.0%. So, for example, as described more fully below, if one of the Al targets used in the method of fabricating the piezoelectric layer 104 contains approximately 5 percent Sc, then the Al in the piezoelectric layer 104 has an atomic percentage of approximately 95.0%, while the Sc has an atomic percentage of approximately 5.0%. The atomic consistency of the piezoelectric layer 104 may then be represented as $Al_{0.95}Sc_{0.05}N$.

While many of the representative embodiments relate to scandium-doped AlN, it is noted that other rare-earth dopants are contemplated for doping the piezoelectric material of piezoelectric layer 108 in order to achieve a particular bandwidth, acoustic coupling coefficient ($kt^2$) value and a series resonance frequency ($F_s$), with the aim of reducing the thickness of the piezoelectric layer 108 and increasing the thickness of the first electrode 101 and the second electrode 107 compared to the thickness of these layers in known FBARs that do not include piezoelectric layers comprising rare-earth doped piezoelectric material. Specifically, the other rare-earth elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare-earth elements, although specific examples are discussed herein.

Figure 2:
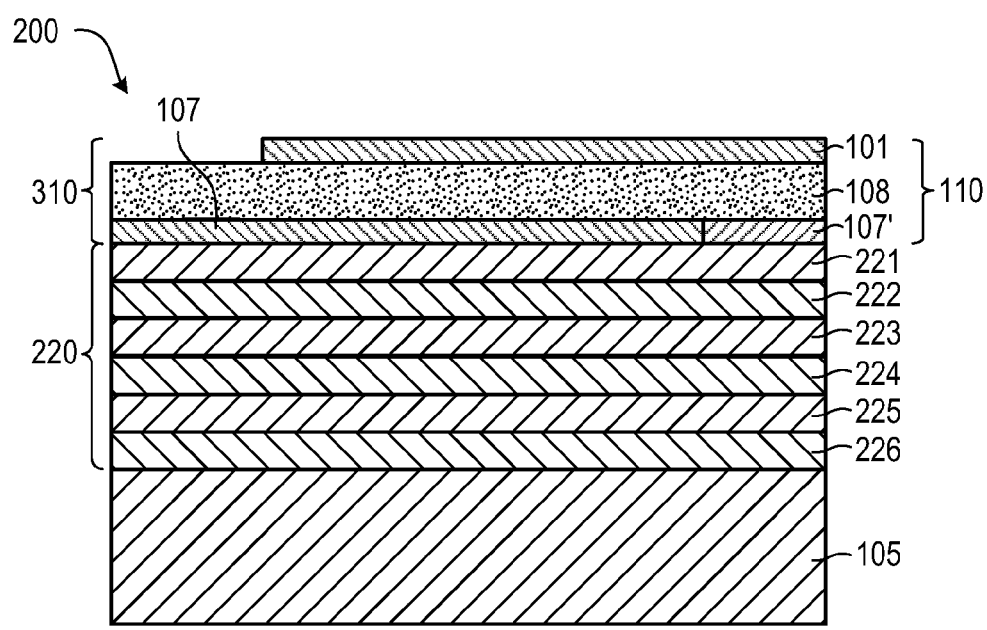
FIG. 2 is a cross-sectional view of an SMR, in accordance with alternative representative embodiments.

FIG. 2 shows a cross-sectional view of an SMR 200 in accordance with a representative embodiment. Many of the components of the SMR 200 are substantially identical as the corresponding elements discussed above with reference to the FBAR 100 in FIG. 1B. Most notably, the materials and thicknesses of first and second electrodes 101, 107 and the piezoelectric layer 108 described in connection with FBAR 100 are substantively the same as the first and second electrodes 101, 107 and the piezoelectric layer 108 described below in connection with SMR 200. Generally, the details of these substantially identical elements are not repeated in the description of representative embodiments of SMR 200 in order to avoid obscuring its description.

Rather than acoustic reflector 106 comprising a cavity as described above in connection with FBAR 100, SMR 200 comprises acoustic reflector 220 comprising alternating layers of high and low acoustic impedance formed in or over the substrate 205. Notably, an overlap of the acoustic reflector 220, the first electrode 101, the second electrode 107 and the piezoelectric layer 108 defines an active area of the SMR 200.

The acoustic reflector 220 may be a distributed Bragg reflector (DBR) or other acoustic mirror, for example, formed of multiple acoustic impedance layers, indicated by representative six (6) acoustic impedance layers 221 to 226. The second electrode 107 and the planarization layer 107' are disposed over the acoustic reflector 120, the piezoelectric layer 108 is disposed over the second electrode 107, and the first electrode 101 is disposed over the piezoelectric layer 308. As should be appreciated by one of ordinary skill in the art, the structure provided by the second electrode 107, the piezoelectric layer 108 and the first electrode 101 forms the acoustic stack 110 of a BAW resonator.

In accordance with a representative embodiment, the acoustic reflector 220 is formed in or over the top of the substrate 105 and provides acoustic isolation between the substrate 105 and the acoustic stack 110. The acoustic impedance layers 221 to 226 of the acoustic reflector 220 are formed of materials having different acoustic impedances. For example, the acoustic impedance layers 221 to 226 may have alternating low and high acoustic impedances, such that acoustic impedance layer 221 has relatively low acoustic impedance, acoustic impedance layer 222 has relatively high acoustic impedance, acoustic impedance layer 223 has relatively low acoustic impedance, acoustic impedance layer 224 has relatively high acoustic impedance, acoustic impedance layer 225 has relatively low acoustic impedance, and acoustic impedance layer 226 has relatively high acoustic impedance. These differing acoustic impedances can be obtained, for instance, by forming the odd numbered acoustic impedance layers 221, 223 and 225 of a relatively soft material, and forming the even numbered acoustic impedance layers 222, 224 and 226 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the less expensive and more straightforward mirror growth and post-processing).

The amount of acoustic isolation provided by acoustic reflector 220 generally depends on the contrast between the acoustic impedances of adjacent acoustic impedance layers 221 to 226, with a greater amount of contrast creating better acoustic isolation. In some embodiments, the acoustic reflector 220 is formed in pairs of dielectric material and metal, or alternating pairs of dielectric materials having contrasting acoustic impedances. For example, the odd numbered acoustic impedance layers 221, 223 and 225 may be formed of a material having low acoustic impedance, such as silicon oxide ($SiO_x$), where x is an integer, while the even numbered acoustic impedance layers 222, 224 and 226, paired with corresponding odd numbered acoustic impedance layers 221, 223 and 225, may be formed of a material having high acoustic impedance, such as tungsten (W) or molybdenum (Mo). In another example, the odd numbered acoustic impedance layers 221, 223 and 225 may be formed of carbon-doped silicon oxide (CDO), while the even numbered acoustic impedance layers 222, 224 and 226, paired with corresponding odd numbered acoustic impedance layers 221, 223 and 225, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 220 may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 220 may vary without departing from the scope of the present teachings. The present teachings contemplate the use of FBARs (e.g., FBAR 100) or SMRs (e.g., SMR 200) in a variety of applications, including filters (e.g., ladder filters comprising a plurality of BAW resonators).

Figure 3:
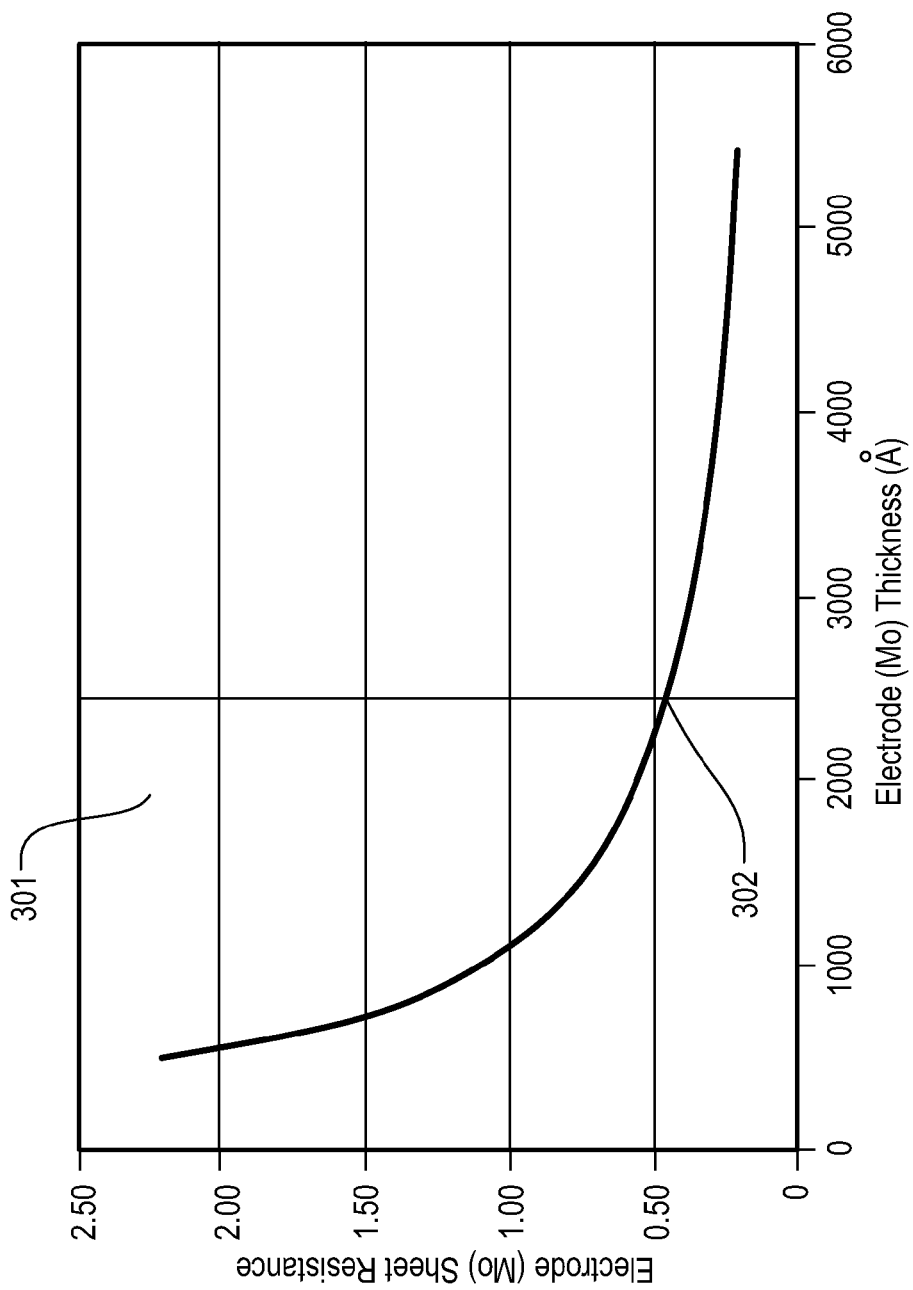
FIG. 3 is a graph showing the sheet resistance versus thickness for a molybdenum layer.

FIG. 3 is a graph showing the sheet resistance versus thickness for a molybdenum layer. As noted above, the series resonance frequency ($F_s$) of the BAW resonator is governed by, inter alia, the total thickness of the layers of the acoustic stack. As can be appreciated, as the series resonance frequency increases, the total thickness of the acoustic stack decreases. However, the bandwidth of the BAW resonator determines the thickness of the piezoelectric layer, and for a desired bandwidth a certain electromechanical coupling coefficient ($kt^2$) is required to meet that particular bandwidth requirement. The $kt^2$ of a BAW resonator is influenced by several factors, such as the dimensions (e.g., thickness and area), composition, and structural properties of the piezoelectric material and electrodes. Generally, for a particular piezoelectric material, a greater $kt^2$ requires a greater thickness of piezoelectric material. As such, once the bandwidth is determined, the $kt^2$ is set, and the thickness of the piezoelectric layer of the BAW resonator is fixed. Accordingly, if a higher series resonance frequency ($F_s$) for a particular BAW resonator is desired, any reduction in thickness of the layers in the acoustic stack cannot be made in the piezoelectric layer, but rather must be made by reducing the thickness of the electrodes in the acoustic resonator stack. The reduction in the thickness of the electrodes required to realize a desired series resonance frequency ($F_s$) comes at the expense of performance of the BAW resonator. For example, reduced electrode thickness results in a higher sheet resistance in the electrodes of the acoustic stack. The higher sheet resistance results in a higher series resistance (Rs) of the BAW resonator and an undesired lower quality factor around series resonance frequency Fs (Qs). Moreover, as electrode thickness decreases, the acoustic stack becomes less favorable for high parallel resistance (Rp) and as a result the quality factor around parallel resonance frequency Fp (Qp) is undesirably reduced.

Turning to FIG. 3, it is shown that beginning in a region 301, the sheet resistance of a layer of molybdenum (Mo) increases exponentially with reduced thickness. In practice, a layer having a thickness of approximately 2000 Å to approximately 2500 Å (near point 402) has a sheet resistance that is approximately the maximum sheet resistance that can be used in the acoustic stack of the BAW resonator while maintaining suitably reduced series resistance (Rs), a suitably high parallel resistance (Rp), and suitably high resonator Q (Qs and Qp). However, as increases in series resonance frequency (Fs) are desired, realizing the desired electromechanical coupling coefficient ($kt^2$), would require a decrease in the thickness of the piezoelectric layer of the BAW resonator, which cannot be realized using known undoped piezoelectric layers. Rather, by including doped piezoelectric materials in the piezoelectric layer 108 of the FBAR 100 or SMR 200, a certain electromechanical coupling coefficient ($kt^2$) can be realized at a comparatively reduced thickness for a particular series resonance frequency (Fs).

Figure 4A:
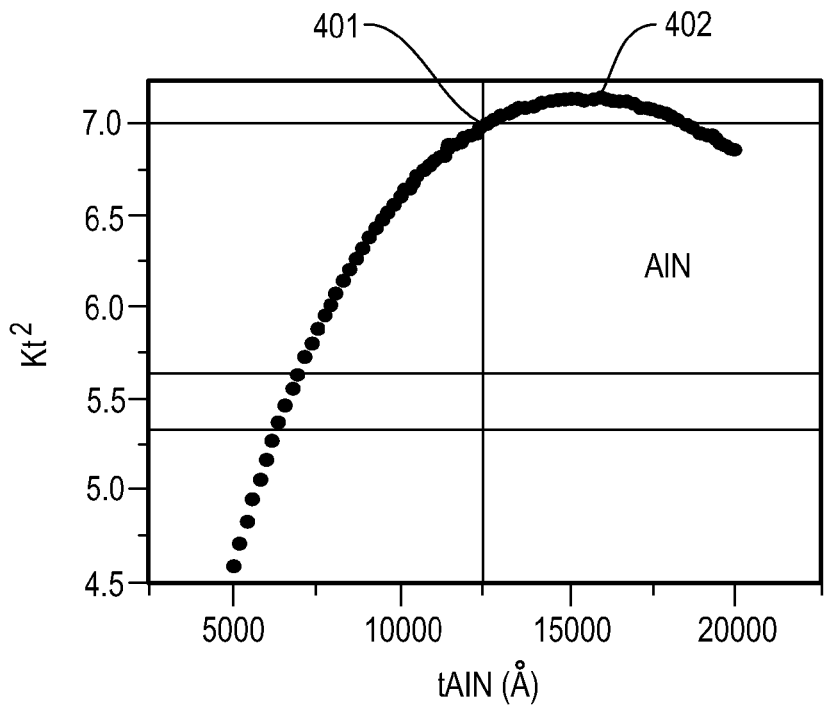
FIG. 4A is a graph showing acoustic coupling coefficient ($kt^2$) versus thickness of an undoped aluminum nitride piezoelectric layer.

FIG. 4A is a graph showing acoustic coupling coefficient ($kt^2$) versus thickness of an undoped aluminum nitride (AlN) piezoelectric layer. The AlN layer is provided in a known BAW resonator provided in a filter (e.g., a ladder filter comprising a number of BAW resonators). It is noted that the use of AlN as the piezoelectric material is merely illustrative, and other piezoelectric materials are contemplated for use in the acoustic stack of the BAW resonator.

The BAW resonator has a series resonance frequency (Fs) of approximately 2200 MHz, and the filter has a bandwidth of approximately 75 MHz. As depicted, in order to meet this bandwidth requirement at this series resonance frequency (Fs), the electromechanical coupling coefficient ($kt^2$) is approximately 7% (point 401). Notably, the maximum electromechanical coupling coefficient ($kt^2$) that can be reached with this piezoelectric material at the specific series resonance frequency (Fs) is approximately 7.2% (point 402). As can be seen from a review of FIG. 4A, an electromechanical coupling coefficient ($kt^2$) of 7% requires that the undoped layer of AlN have a thickness of approximately 12500 Å. As noted above, in order to maintain this particular filter bandwidth at the selected series resonance frequency (Fs), the thickness of the AlN layer cannot be reduced.

Figure 4B:
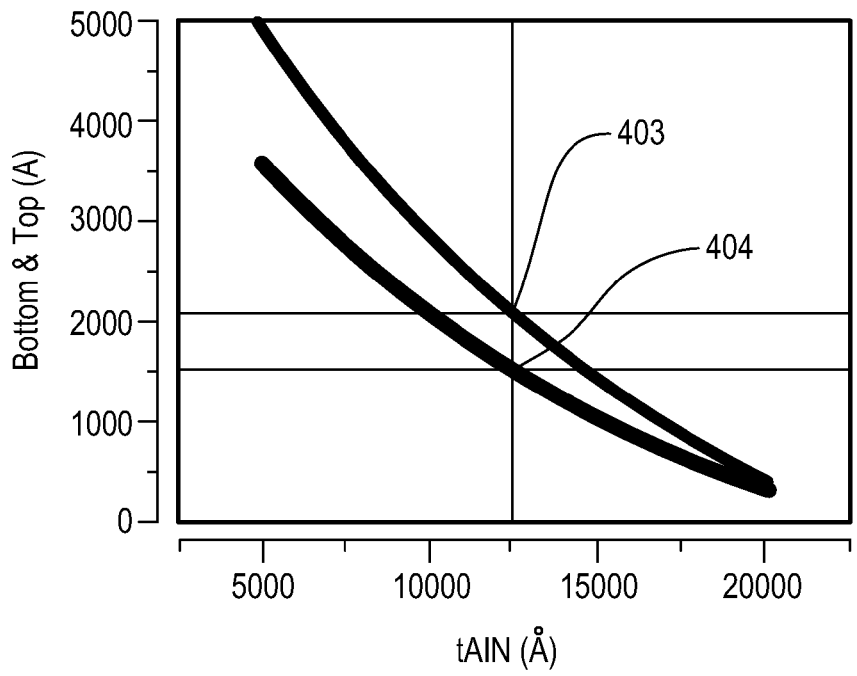
FIG. 4B is a graph showing thickness of first and second electrodes versus thickness of an undoped aluminum nitride piezoelectric layer of a BAW resonator having a particular series resonance frequency ($F_s$).

FIG. 4B is a graph showing thickness of first and second electrodes versus thickness of an undoped aluminum nitride piezoelectric layer of a BAW resonator having a particular series resonance frequency ($F_s$). Notably, for the required acoustic coupling coefficient ($kt^2$) of 7% at a series resonance frequency (Fs) of approximately 2200 MHz, the thickness of the bottom electrode in the acoustic stack of the known BAW resonator must be approximately 2200 Å (point 403), and the thickness of the top electrode in the acoustic stack of the known BAW resonator must be approximately 1500 Å. Accordingly, in the known BAW resonator of a known filter, in order to meet the specified performance requirement, the specified acoustic coupling coefficient ($kt^2$) is needed. To achieve this acoustic coupling coefficient ($kt^2$), the thickness of the AlN piezoelectric layer is substantially fixed, and the corresponding thicknesses of the electrodes of the acoustic stack of the known BAW resonator are limited to comparatively low thicknesses.

The comparatively low thickness of the electrodes of the acoustic stack of the known BAW resonator result in higher sheet resistance, which in turn result in a higher series resistance (Rs) of the BAW resonator and increased Ohmic loss. Moreover, the comparatively high sheet resistance of the electrodes of the known BAW resonator has an undesirably lower quality factor around series resonance frequency Fs (Qs). Moreover, with the comparatively low electrode thickness, the acoustic stack of the known BAW resonator becomes less favorable for high parallel resistance (Rp) and as a result the quality factor around parallel resonance frequency Fp (Qp) is undesirably reduced. As such, the known BAW resonator, the components of which are described in connection with FIGS. 4A and 4B, has unacceptable Ohmic loss, and unacceptably low Q values.

Figure 5A:
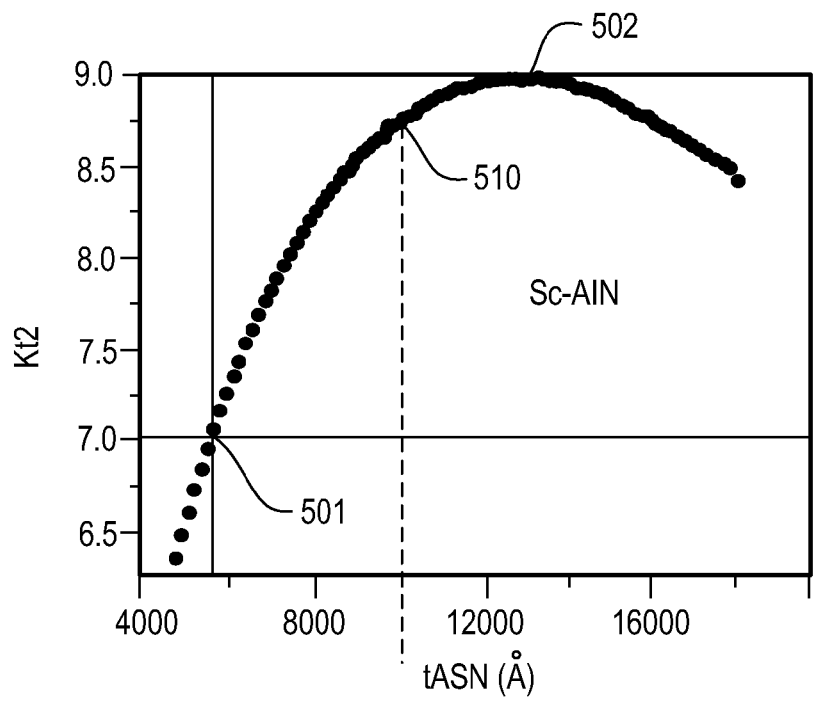
FIG. 5A is a graph showing acoustic coupling coefficient ($kt^2$) versus thickness of a rare-earth doped aluminum nitride piezoelectric layer in accordance with a representative embodiment.

FIG. 5A is a graph showing acoustic coupling coefficient ($kt^2$) versus thickness of a rare-earth doped aluminum nitride piezoelectric layer in accordance with a representative embodiment. The AlN layer is provided in a known BAW resonator provided in a filter (e.g., a ladder filter comprising a number of BAW resonators). It is noted that the use of AlN as the piezoelectric material is merely illustrative, and other piezoelectric layers are contemplated for use in the acoustic stack of the BAW resonator of the representative embodiment. Of course, for the purposes of comparison of known BAW resonators and BAW resonators of representative embodiments presented in connection with the descriptions of FIGS. 4A~5B, the acoustic stack of the known BAW resonator comprises an undoped layer of the selected piezoelectric layer, whereas the BAW resonator of the representative embodiments comprises a doped layer of the selected piezoelectric layer.

Illustratively, the BAW resonator may be an FBAR (e.g., FBAR 100) or an SMR (e.g., SMR 200) described above in accordance with a representative embodiment. Moreover, the BAW resonator illustratively comprises a scandium doped aluminum piezoelectric layer, with a doping level of approximately 5 atomic percent Sc. It is noted that the use of scandium as the rare-earth element dopant is merely illustrative, and other rare earth element dopants are contemplated for use in the acoustic stack of the BAW resonator of the representative embodiment. Furthermore, the doping level of approximately 5.0 atomic percent Sc is also illustrative, and may be greater or less than this doping level in order to attain a desired electromechanical coupling coefficient ($kt^2$) at a specific series resonance frequency (Fs).

Figure 5B:
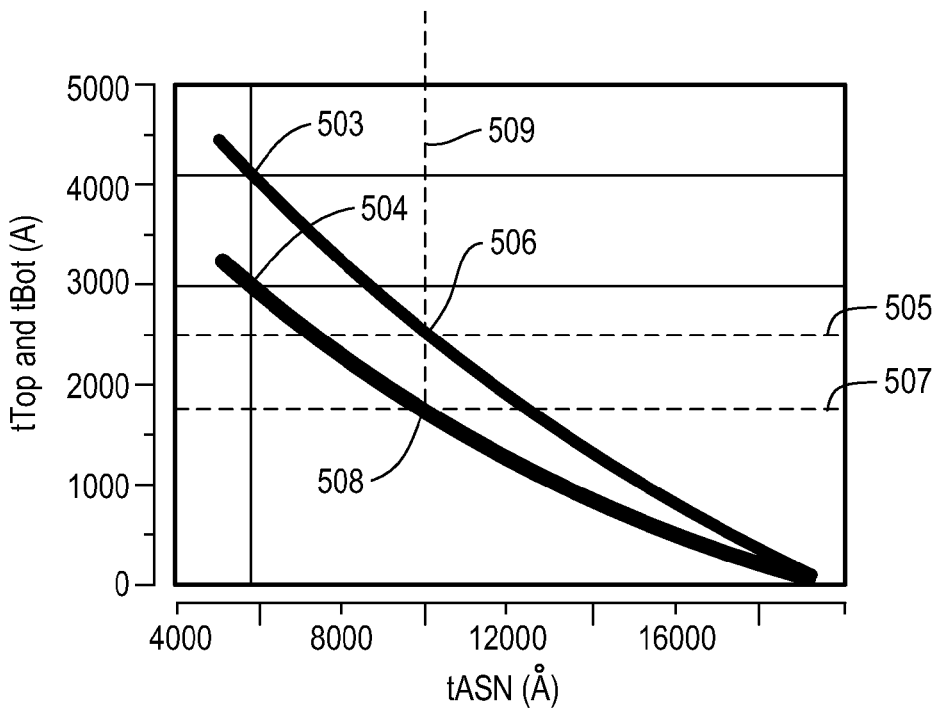
FIG. 5B is a graph showing thickness of first and second electrodes versus thickness of a rare-earth element aluminum nitride piezoelectric layer of a BAW resonator having a particular series resonance frequency ($F_s$), in accordance with a representative embodiment.

The series resonance frequency of the BAW resonator described in connection with FIGS. 5A~5B is the same as that of the known BAW resonator described in connection with FIGS. 4A~4B, namely 2200 MHz. Similarly, the bandwidth requirement of the BAW resonator described in connection with FIGS. 5A~5B is the same as that of the known BAW resonator described in connection with FIGS. 4A~4B, namely 75 MHZ.

In order to meet this bandwidth requirement at this series resonance frequency (Fs), the electromechanical coupling coefficient ($kt^2$) is, again, approximately 7% (point 501). Notably, the maximum electromechanical coupling coefficient ($kt^2$) that can be reached with this piezoelectric material at the specific series resonance frequency (Fs) is approximately 9% (point 502). As can be seen from a review of FIG. 5A, an electromechanical coupling coefficient ($kt^2$) of 7% requires that the Sc-doped AlN layer of AlN have a thickness of approximately 6000 Å. By attaining the desired electromechanical coupling coefficient ($kt^2$) with a significantly lower thickness than that of the undoped AlN layer of the known BAW resonator, the thickness constraints on the electrodes of the BAW resonator of the representative embodiment are significantly relaxed.

FIG. 5B is a graph showing thickness of first and second electrodes versus thickness of the rare-earth element aluminum nitride piezoelectric layer of the BAW resonator having the selected series resonance frequency ($F_s$), in accordance with a representative embodiment. Notably, for the required acoustic coupling coefficient ($kt^2$) of 7% at a series resonance frequency (Fs) of approximately 2200 MHz, the thickness of the bottom electrode in the acoustic stack of the BAW resonator of a representative embodiment is approximately 4100 Å (point 503), and the thickness of the top electrode in the acoustic stack of the known BAW resonator must be approximately 3000 Å (point 504). Accordingly, in the BAW resonator of a filter in accordance with a representative embodiment, in order to meet the specified performance requirement, the specified acoustic coupling coefficient ($kt^2$) is needed. To achieve this acoustic coupling coefficient ($kt^2$), the thickness of the AlN piezoelectric layer is considerably reduced compared to the known BAW resonator comprising the undoped AlN piezoelectric layer, and the corresponding thicknesses of the electrodes of the acoustic stack of the BAW resonator of the representative embodiment are significantly greater than those of the known BAW resonator that includes an undoped AlN piezoelectric layer. As such, the sheet resistance of the electrodes of the acoustic stack of the BAW resonator of representative embodiments is substantially reduced compared to those of the known BAW resonator described in connection with FIGS. 4A~4B. To this end, for the purposes of illustration electrodes are made of molybdenum.

A review of the sheet resistance versus electrode thickness set forth in FIG. 3 reveals the significant reduction in sheet resistance between the bottom electrode of the known BAW resonator (thickness 2200 Å) and the bottom electrode of the BAW resonator of the representative embodiment (4100 Å), and the top electrode of the known BAW resonator (thickness 1500 Å) and the top electrode of the BAW resonator of the representative embodiment (3000 Å). The comparatively lower sheet resistance of the electrodes of the acoustic stack of a BAW resonator of a representative embodiment results in a lower series resistance (Rs) of the BAW resonator and decreased Ohmic loss compared to those of the known BAW resonator described in connection with FIGS. 4A~4B. Moreover, the comparatively low sheet resistance of the electrodes of the BAW resonator of the representative embodiment results in an improved quality factor around series resonance frequency Fs (Qs). Moreover, with the comparatively greater electrode thickness, the acoustic stack of the BAW resonator of the representative embodiments becomes more favorable for high parallel resistance (Rp) and as a result the quality factor around parallel resonance frequency Fp (Qp) is beneficially increased compared to that of the known BAW resonator.

In addition to the above-noted improvements in the performance of the BAW resonator of representative embodiments, the doped piezoelectric layer of the representative embodiments affords other improvements as well. Specifically, an acoustic coupling coefficient ($kt^2$) of 8.5% (point 510) can be attained with the noted dopant and doping levels of the doped piezoelectric layer of the representative embodiment. This increased acoustic coupling coefficient ($kt^2$) provides an increased bandwidth at the selected series resonance frequency (Fs) (2200 MHz). Yet, from a review of FIG. 5B, it can be appreciated that the thicknesses of the bottom and top electrodes (points 506 and 508 respectively) are just reaching the lower limit of electrode thickness in order to provide suitable performance of the BAW resonators. Notably, dotted line 505 crosses vertical line 509 at approximately 2500 Å (point 506), whereas dotted line 507 crosses vertical line 509 at approximately 2000 Å (point 508). So, even as the thicknesses of the bottom and top electrodes of the acoustic stack of a BAW resonator of a representative embodiment reach the acceptable minimum level, the bandwidth of the filters comprising BAW resonators of representative embodiments can be significantly increased.

More generally, for the BAW resonator described in connection with FIGS. 5A~5B having the Sc-doped AlN piezoelectric layer doped to 5 atomic percent and the series resonance frequency ($F_s$) of 2200 MHz, depending on the desired bandwidth, the electromechanical coupling coefficient $kt^2$ can range from approximately 6.5% to approximately 9.0%. With these parameters, the Sc-doped piezoelectric layer has a thickness in the range of approximately of approximately 4600 Å to approximately 12000 Å. Moreover, the thickness of the first electrode is in the range of approximately 3300 Å to approximately 2000 Å; and the thickness of the second electrode is in the range of approximately 4500 Å to approximately 2500 Å.

Figure 6A:
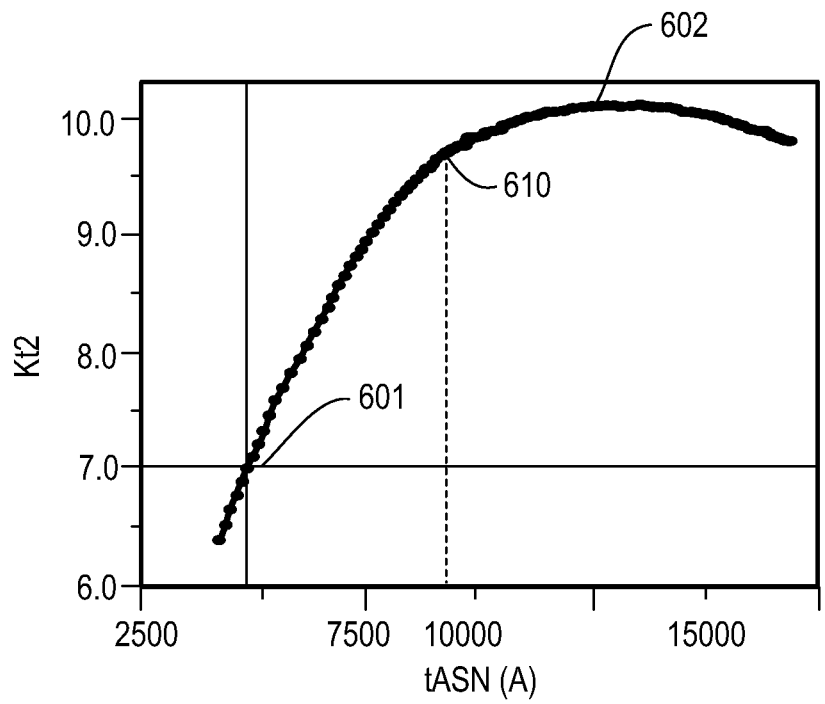
FIG. 6A is a graph showing acoustic coupling coefficient ($kt^2$) versus thickness of a rare-earth doped aluminum nitride piezoelectric layer in accordance with a representative embodiment.

FIG. 6A is a graph showing acoustic coupling coefficient ($kt^2$) versus thickness of a rare-earth doped aluminum nitride piezoelectric layer in accordance with a representative embodiment. The AlN layer is provided in a known BAW resonator provided in a filter (e.g., a ladder filter comprising a number of BAW resonators). It is noted that the use of AlN as the piezoelectric material is merely illustrative, and other piezoelectric layers are contemplated for use in the acoustic stack of the BAW resonator of the representative embodiment. Of course, for the purposes of comparison of known BAW resonators and BAW resonators of representative embodiments presented in connection with the descriptions of FIGS. 4A~5B, the acoustic stack of the known BAW resonator comprises an undoped layer of the selected piezoelectric layer, whereas the BAW resonator of the representative embodiments comprises a doped layer of the selected piezoelectric layer.

Illustratively, the BAW resonator may be an FBAR (e.g., FBAR 100) or an SMR (e.g., SMR 200) described above in accordance with a representative embodiment. Moreover, the BAW resonator illustratively comprises a scandium doped aluminum piezoelectric layer, with a doping level of approximately 9 atomic percent Sc. It is noted that the use of scandium as the rare-earth element dopant is merely illustrative, and other rare earth element dopants are contemplated for use in the acoustic stack of the BAW resonator of the representative embodiment. Furthermore, the doping level of approximately 9.0 atomic percent Sc is also illustrative, and may be greater or less than this doping level in order to attain a desired electromechanical coupling coefficient ($kt^2$) at a specific series resonance frequency (Fs).

Figure 6B:
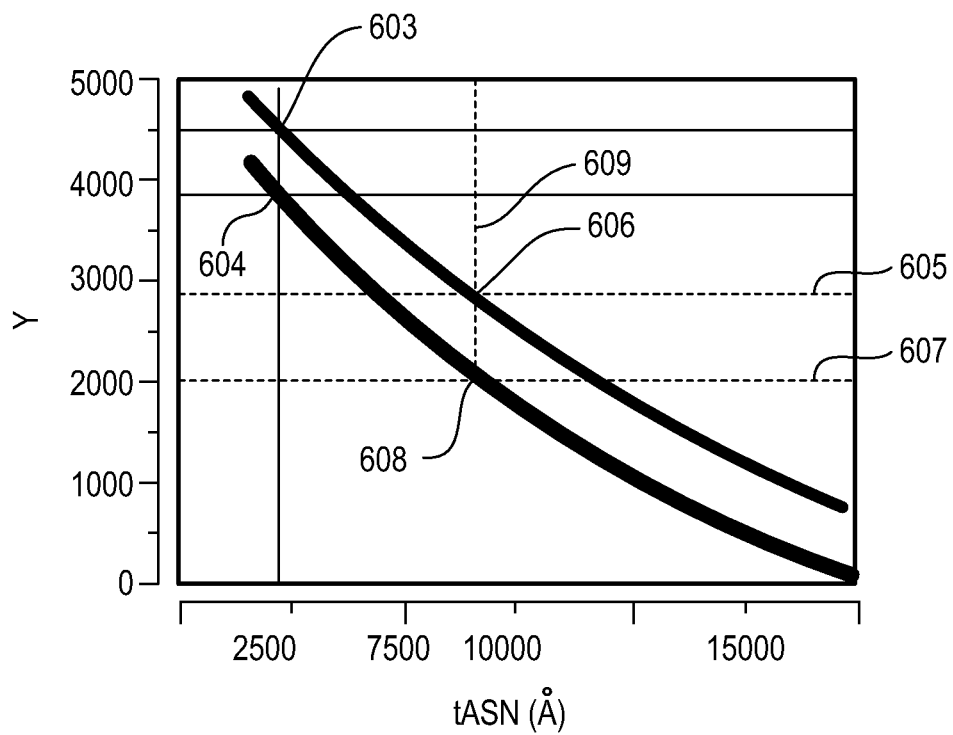
FIG. 6B is a graph showing thickness of first and second electrodes versus thickness of a rare-earth element aluminum nitride piezoelectric layer of a BAW resonator having a particular series resonance frequency ($F_s$), in accordance with a representative embodiment.

The series resonance frequency of the BAW resonator described in connection with FIGS. 6A~6B is the same as that of the known BAW resonator described in connection with FIGS. 4A~4B, namely 2200 MHz. Similarly, the bandwidth requirement of the BAW resonator described in connection with FIGS. 6A~6B is the same as that of the known BAW resonator described in connection with FIGS. 4A~4B, namely 75 MHZ.

In order to meet this bandwidth requirement at this series resonance frequency (Fs), the electromechanical coupling coefficient ($kt^2$) is, again, approximately 7% (point 601). Notably, the maximum electromechanical coupling coefficient ($kt^2$) that can be reached with this piezoelectric material at the specific series resonance frequency (Fs) is approximately 10% (point 602). As can be seen from a review of FIG. 6A, an electromechanical coupling coefficient ($kt^2$) of 7% requires that the Sc-doped AlN layer of AlN have a thickness of approximately 4500 Å. By attaining the desired electromechanical coupling coefficient ($kt^2$) with a significantly lower thickness than that of the undoped AlN layer of the known BAW resonator, the thickness constraints on the electrodes of the BAW resonator of the representative embodiment are significantly relaxed.

FIG. 6B is a graph showing thickness of first and second electrodes versus thickness of the rare-earth element aluminum nitride piezoelectric layer of the BAW resonator having the selected series resonance frequency ($F_s$), in accordance with a representative embodiment. Notably, for the required acoustic coupling coefficient ($kt^2$) of 7% at a series resonance frequency (Fs) of approximately 2200 MHz, the thickness of the bottom electrode in the acoustic stack of the BAW resonator of a representative embodiment is approximately 4500 Å (point 603), and the thickness of the top electrode in the acoustic stack of the known BAW resonator must be approximately 3700 Å (point 604). Accordingly, in the BAW resonator of a filter in accordance with a representative embodiment, in order to meet the specified performance requirement, the specified acoustic coupling coefficient ($kt^2$) is needed. To achieve this acoustic coupling coefficient ($kt^2$), the thickness of the AlN piezoelectric layer is considerably reduced compared to the known BAW resonator comprising the undoped AlN piezoelectric layer, and the corresponding thicknesses of the electrodes of the acoustic stack of the BAW resonator of the representative embodiment are significantly greater than those of the known BAW resonator that includes an undoped AlN piezoelectric layer. As such, the sheet resistance of the electrodes of the acoustic stack of the BAW resonator of representative embodiments is substantially reduced compared to those of the known BAW resonator described in connection with FIGS. 4A~4B. To this end, for the purposes of illustration supposed the electrodes were made of molybdenum.

A review of the sheet resistance versus electrode thickness set forth in FIG. 3 reveals the significant reduction in sheet resistance between the bottom electrode of the known BAW resonator (thickness 2200 Å) and the bottom electrode of the BAW resonator of the representative embodiment (4500 Å), and the top electrode of the known BAW resonator (thickness 1500 Å) and the top electrode of the BAW resonator of the representative embodiment (3700 Å). The comparatively lower sheet resistance of the electrodes of the acoustic stack of a BAW resonator of a representative embodiment results in a lower series resistance (Rs) of the BAW resonator and decreased Ohmic loss compared to those of the known BAW resonator described in connection with FIGS. 4A~4B. Moreover, the comparatively low sheet resistance of the electrodes of the BAW resonator of the representative embodiment results in an improved quality factor around series resonance frequency Fs (Qs). Moreover, with the comparatively greater electrode thickness, the acoustic stack of the BAW resonator of the representative embodiments becomes more favorable for high parallel resistance (Rp) and as a result the quality factor around parallel resonance frequency Fp (Qp) is beneficially increased compared to that of the known BAW resonator.

In addition to the above-noted improvements in the performance of the BAW resonator of representative embodiments, the doped piezoelectric layer of the representative embodiments affords other improvements as well. Specifically, an acoustic coupling coefficient ($kt^2$) of 9.7% (point 610) can be attained with the noted dopant and doping levels of the doped piezoelectric layer of the representative embodiment. This increased acoustic coupling coefficient ($kt^2$) provides an increased bandwidth at the selected series resonance frequency (Fs) (2200 MHz). Yet, from a review of FIG. 6B, it can be appreciated that the thicknesses of the bottom and top electrodes (points 606 and 608 respectively) are just reaching the lower limit of electrode thickness in order to provide suitable performance of the BAW resonators. Notably, dotted line 605 crosses vertical line 609 at approximately 2900 Å (point 606), whereas dotted line 607 crosses vertical line 609 at approximately 2000 Å (point 608). So, even as the thicknesses of the bottom and top electrodes of the acoustic stack of a BAW resonator of a representative embodiment reach the acceptable minimum level, the bandwidth of the filters comprising BAW resonators of representative embodiments can be significantly increased.

More generally, for the BAW resonator described in connection with FIGS. 6A~6B having the Sc-doped AlN piezoelectric layer doped to 9.0 atomic percent and the series resonance frequency ($F_s$) of 2200 MHz, depending on the desired bandwidth, the electromechanical coupling coefficient $kt^2$ can range from approximately 6.5% to approximately 9.7%. With these parameters, the Sc-doped piezoelectric layer has a thickness in the range of approximately of approximately 4200 Å to approximately 10000 Å. Moreover, the thickness of the first electrode is in the range of approximately 3900 Å to approximately 2000 Å; and the thickness of the second electrode is in the range of approximately 4500 Å to approximately 2900 Å.

It is emphasized that the specific piezoelectric material, rare-earth dopant and doping level used to realize the specific electromechanical coupling coefficient $kt^2$ described in connection with FIGS. 5A~6B are merely illustrative and other materials, dopants and doping levels are contemplated with the overall goal of providing an electromechanical coupling coefficient $kt^2$ of a suitable value to provide a desired bandwidth yet having a lower thickness than the same piezoelectric material that is undoped, in order to maintain or improve the above-mentioned performance parameters of BAW resonators of representative embodiments by allowing for electrodes in the acoustic stack to have thicknesses greater than those of known BAW resonators that include undoped piezoelectric layers.

One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator comprising:
a first electrode having a first electrode thickness;
a second electrode having a second electrode thickness; and
a piezoelectric layer having a piezoelectric layer thickness and being disposed between the first and second electrodes, the piezoelectric layer comprising a piezoelectric material doped with at least one rare earth element, wherein for a particular acoustic coupling coefficient ($kt^2$) value and series resonance frequency ($F_s$) of the BAW resonator, the first electrode thickness and the second electrode thickness are respectively greater than a thickness of a first electrode and a thickness of a second electrode of a comparable BAW resonator comprising identical layers and materials except for comprising an undoped piezoelectric layer of the same piezoelectric material.

2. A BAW resonator as claimed in claim 1, wherein, for the particular $F_s$ and $kt^2$ value, the piezoelectric layer comprising the piezoelectric material doped with at least one rare earth element is thinner than a thickness of the undoped piezoelectric layer of the comparable BAW resonator.

3. A BAW resonator as claimed in claim 2, wherein, for the particular $F_s$ and $kt^2$ value, the first electrode thickness and the second electrode thickness are respectively approximately twice the first electrode thickness and the second electrode thickness of the comparable BAW resonator comprising the undoped piezoelectric layer.

4. A BAW resonator as claimed in claim 2, wherein, for the particular $F_s$ and $kt^2$ value, the thickness of the piezoelectric layer comprising the piezoelectric material doped with at least one rare earth element is approximately one-half the thickness of the undoped piezoelectric layer of the comparable BAW resonator.

5. A BAW resonator as claimed in claim 1, wherein, for the particular $F_s$ and $kt^2$ value, the first electrode thickness and the second electrode thickness are respectively approximately twice the first electrode thickness and the second electrode thickness of the comparable BAW resonator comprising the undoped piezoelectric layer.

6. A BAW resonator as claimed in claim 1, wherein the $kt^2$ is approximately 7.0%.

7. A BAW resonator as claimed in claim 6, wherein the piezoelectric layer comprising the piezoelectric material doped with at least one rare earth element has a thickness of approximately 5800 Å.

8. A BAW resonator as claimed in claim 6, wherein the first electrode has a thickness of approximately 4100 Å.

9. A BAW resonator as claimed in claim 6, wherein the second electrode has a thickness of approximately 3000 Å.

10. A BAW resonator as claimed in claim 1, wherein the $kt^2$ is in the range of approximately 6.5% to approximately 9.0%.

11. A BAW resonator as claimed in claim 10, wherein the piezoelectric layer comprising the piezoelectric material doped with at least one rare earth element has a thickness in the range of approximately 4600 Å to approximately 12000 Å.

12. A BAW resonator as claimed in claim 10, wherein the second electrode has a thickness in the range of approximately 3300 Å to approximately 2000 Å.

13. A BAW resonator as claimed in claim 10, wherein the first electrode of has a thickness in the range of approximately 4500 Å to approximately 2500 Å.

14. A BAW resonator as claimed in claim 1, further comprising an acoustic reflector disposed beneath the first electrode, the second electrode and the piezoelectric layer, wherein an overlap of the acoustic reflector, the first electrode, the second electrode and the piezoelectric layer defines an active area of the acoustic resonator.

15. A BAW resonator as claimed in claim 14, wherein the acoustic reflector comprises a cavity disposed in a substrate over which the first electrode, the second electrode and the piezoelectric layer are disposed.

16. A BAW resonator as claimed in claim 14, wherein the acoustic reflector comprises a plurality of layers having alternating high acoustic impedance and low acoustic impedance.

17. A BAW resonator as claimed in claim 1, wherein the piezoelectric material comprises aluminum nitride (AlN).

18. A BAW resonator as claimed in claim 17, wherein the at least one rare earth element is incorporated into a crystal lattice of the AlN piezoelectric material.

19. A BAW resonator as claimed in claim 17, wherein the at least one rare earth element comprises scandium (Sc).

20. A BAW resonator as claimed in claim 19, wherein an atomic percentage of the Sc in the AlN piezoelectric material is approximately 0.5% to less than approximately 10.0%.

21. A BAW resonator as claimed in claim 19, wherein an atomic percentage of the Sc in the AlN piezoelectric material is approximately 0.5% to approximately 44%.

22. A BAW resonator as claimed in claim 19, wherein an atomic percentage of the Sc in the AlN piezoelectric material is approximately 2.5% to less than approximately 5.0%.

23. A BAW resonator as claimed in claim 17, wherein the at least one rare earth element comprises two or more rare earth elements incorporated into a crystal lattice of the AlN piezoelectric material.

24. A BAW resonator as claimed in claim 23, wherein the two or more rare earth elements comprise scandium (Sc) and erbium (Er).

25. An BAW resonator as claimed in claim 24, wherein the two or more rare earth elements further comprise yttrium (Y).

* * * * *